United States Patent
Ramm

(10) Patent No.: US 10,001,021 B2
(45) Date of Patent: Jun. 19, 2018

(54) BARRIER LAYER FOR A TURBOCHARGER

(71) Applicant: Oerlikon Surface Solutions AG, Trübbach, Trübbach (CH)

(72) Inventor: Juergen Ramm, Maienfeld (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 195 days.

(21) Appl. No.: 14/893,478

(22) PCT Filed: May 22, 2014

(86) PCT No.: PCT/EP2014/001390
§ 371 (c)(1),
(2) Date: Nov. 23, 2015

(87) PCT Pub. No.: WO2014/187570
PCT Pub. Date: Nov. 27, 2014

(65) Prior Publication Data
US 2016/0215632 A1  Jul. 28, 2016

Related U.S. Application Data

(60) Provisional application No. 61/826,586, filed on May 23, 2013.

(51) Int. Cl.
| | | |
|---|---|---|
| *B32B 9/00* | (2006.01) | |
| *F01D 5/28* | (2006.01) | |
| *C23C 14/08* | (2006.01) | |
| *C23C 14/32* | (2006.01) | |
| *F02B 33/02* | (2006.01) | |

(52) U.S. Cl.
CPC .............. *F01D 5/288* (2013.01); *C23C 14/08* (2013.01); *C23C 14/325* (2013.01); *F02B 33/02* (2013.01); *F05D 2220/40* (2013.01)

(58) Field of Classification Search
CPC ....... C23C 14/325; C23C 14/08; F01D 5/288; F02B 33/02; F05D 2220/10
See application file for complete search history.

(56) References Cited

U.S. PATENT DOCUMENTS

| | | |
|---|---|---|
| 2005/0006006 A1 | 1/2005 | Schall |
| 2008/0193782 A1 | 8/2008 | Ramm et al. |
| 2009/0191417 A1 | 7/2009 | Ramm |
| 2012/0085328 A1* | 4/2012 | Bachmann ............ C23C 14/165 123/668 |

FOREIGN PATENT DOCUMENTS

| | | |
|---|---|---|
| EP | 2041400 B1 | 9/2009 |
| EP | 2112252 A1 | 10/2009 |

(Continued)

OTHER PUBLICATIONS

Ho et al. Surface and Coatings Technology 177-178 (2004) 172-177.*

(Continued)

*Primary Examiner* — Shane Fang

(57) ABSTRACT

A system, in particular a turbocharger with a barrier layer for protecting against high temperature corrosion of parts and/or components of the system or turbocharger that are subjected to high temperatures, where the barrier layer includes at least one Cr—Al—O layer.

5 Claims, 4 Drawing Sheets

(56) References Cited

FOREIGN PATENT DOCUMENTS

| | | |
|---|---|---|
| EP | 2406476 B1 | 12/2012 |
| JP | 2010506049 A | 2/2010 |
| JP | 2011514437 A | 5/2011 |

OTHER PUBLICATIONS

H. Najafi et al., "Formation of Cubic Structured $(Al_{1-x}Cr_x)_{2+\delta}O_3$ and Its Dynamic Transition to Corundum Phase During Cathodic Arc Vaporization," Surface and Coatings Technology, vol. 214, Jan. 1, 2013, pp. 46-52.

\* cited by examiner

BARRIER LAYER FOR A TURBOCHARGER

FIELD OF THE INVENTION

The present invention relates to a system, in particular a turbocharger with a barrier layer for protecting against high temperature corrosion of parts and/or components of the system or turbocharger, which are subjected to high temperatures.

BACKGROUND OF THE INVENTION

EP2112252 has disclosed the use of a barrier layer made of titanium dioxide or a mixture of titanium dioxide with at least one other ceramic material as a thermal insulation layer for reducing the dissipation of heat from parts such as those of turbochargers. This barrier layer is preferably deposited by means of thermal spraying.

Consequently, some parts of a turbocharger according to the prior art are inevitably subjected to high temperatures. Such parts are therefore as a rule composed of very temperature-stable materials such as Ni- and/or Ti alloys, which are very expensive and difficult to produce.

There are also known coatings of parts of turbochargers for other purposes. For example, EP2406476 and EP2041400 disclose catalytic coatings that can be deposited onto surfaces of turbocharger components. According to EP2041400, such a catalytic coating can be used as a means for reducing dirt deposits on a flow-guiding part of a compressor of a turbocharger.

The object of the present invention is to offer a solution for extending the service life of turbocharger components that are subjected to high temperatures.

SUMMARY OF THE INVENTION

This object is attained according to the invention in that turbocharger components that are subjected to high temperatures are coated with an oxidation- and chemical barrier layer, said barrier layer including at least one aluminum chromic oxide layer (Al—Cr—O).

DETAILED DESCRIPTION OF THE PREFERRED EMBODIMENTS

In the context of the present invention, the expression "high temperatures" is understood to mean temperatures greater than 400° C., in particular greater than 500° C.

Barrier layers according to the present invention have turned out to be outstanding barriers against oxidation and chemical attacks, in particular for components in turbochargers that are subjected to temperatures of up to 600° C. and even up to 800° C. and more.

Preferably, the layer is deposited according to the invention by means of a PVD process, preferably by means of reactive arc vaporization without a droplet filter.

Preferably, the layer contains an interface layer of CrN and a functional layer of Al—Cr—O.

Other details of the invention will be described in conjunction with exemplary embodiments:

In order to produce the layers according to two exemplary embodiments I and 2, the following process parameters were used (see Tables 1 and 2):

TABLE 1

Process parameters in the deposition of the interface

| Example | Targets | Discharge current × target | Substrate temperature | Pretreatment (etching process) | Interface (deposition process) |
|---|---|---|---|---|---|
| 1 | 2 × Cr | Cr: 140 A | 450° C. | Cr-metal ion etching (18 min) | CrN (at 3 Pa N2 for 13 min) |
| 2 | 2 × Cr | Cr: 140 A | 450° C. | Cr-metal ion etching (18 min) | CrN (at 3 Pa N2 for 7 min) |

TABLE 2

Process parameters in the deposition of the functional layer

| Example | Targets | Discharge current × target | Substrate temperature | Gas flow | Functional layer |
|---|---|---|---|---|---|
| 1 | 2 × AlCr | AlCr: 200 A | 450° C. | 400 sccm O2 | Al—Cr—O (for 60 min) |
| 2 | 2 × AlCr | AlCr: 200 A | 450° C. | 400 sccm O2 | Al—Cr—O (for 30 min) |

Figure 1:
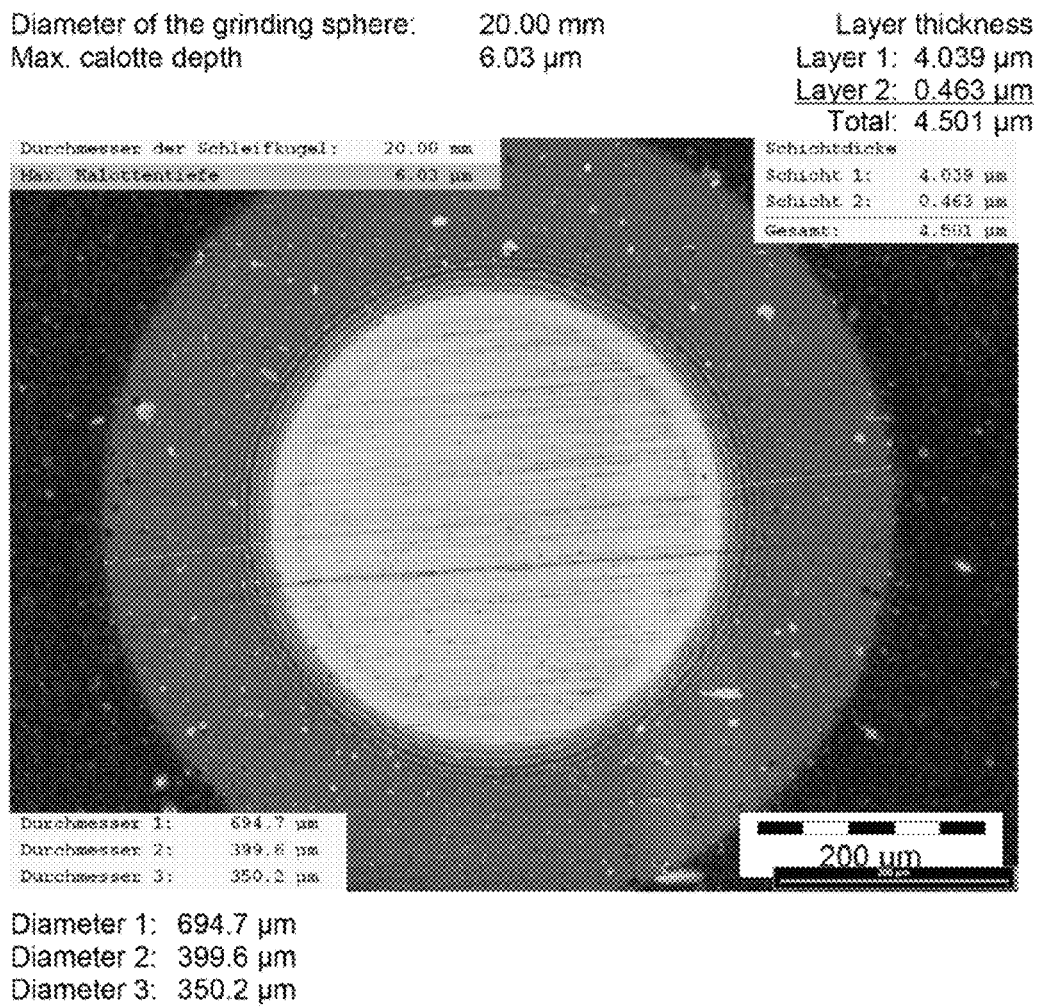
FIG. 1 shows a calotte-grinding measurement for evaluating the layer thickness of the layer 1 resulting from exemplary embodiment 1.
Figure 2:
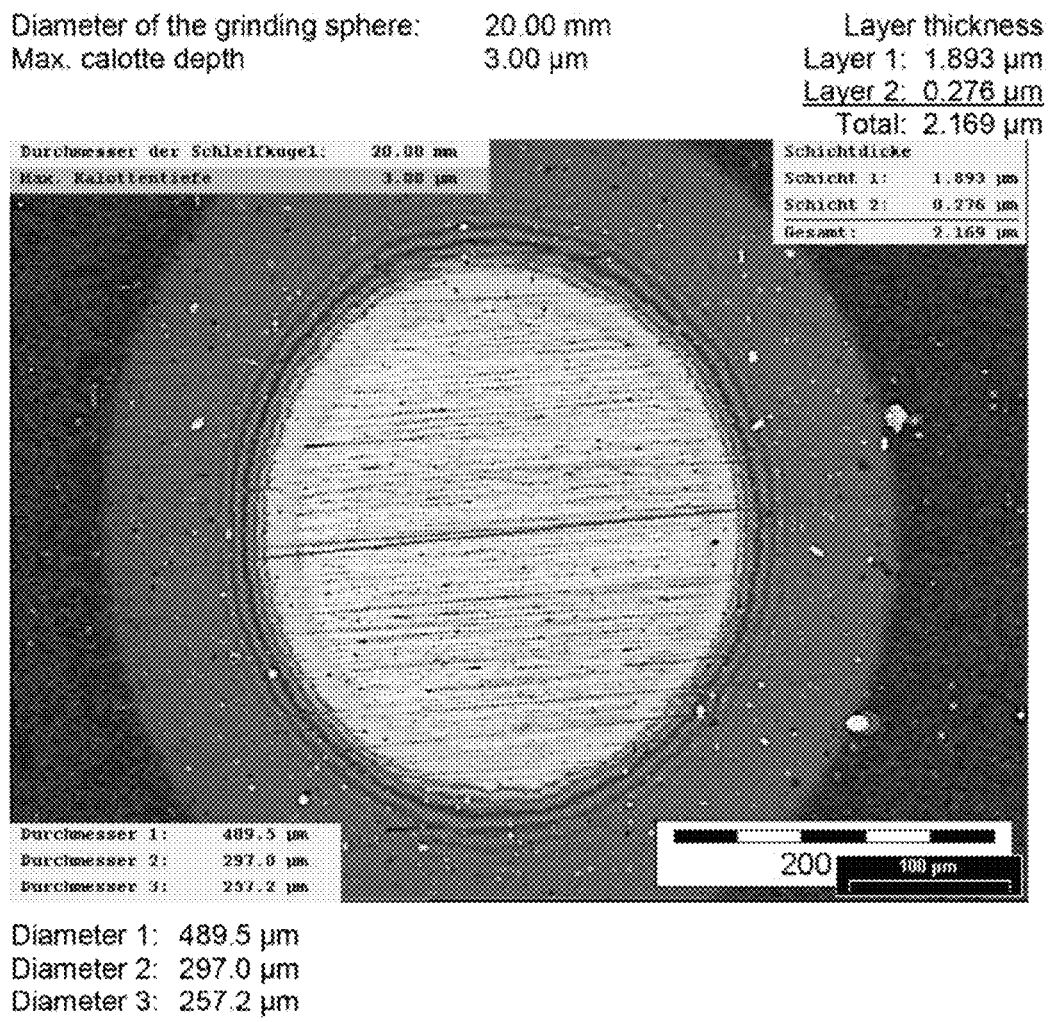
FIG. 2 shows a calotte-grinding measurement for evaluating the layer thickness of the layer 2 resulting from exemplary embodiment 1.

The layer thicknesses of the layers produced according to the invention according to exemplary embodiments 1 and 2 were measured with the aid of a layer thickness testing device using the calotte grinding process (see Table 3 and FIGS. 1 and 2):

TABLE 3

Layer thickness of the layers 1 and 2 resulting from exemplary embodiments 1 and 2

| Example | Interface thickness | Functional layer |
|---------|---------------------|------------------|
| 1 | 0.5 μm | 4.0 μm |
| 2 | 0.3 μm | 1.9 μm |

In order to produce Al—Cr—O layers according to the present invention, preferably targets with an $Al_{1-x}Cr_x$ composition where $0.2 \leq x \leq 0.9$ in atomic concentration are used. In general, these targets are produced by means of powder metallurgy so that any chemical compositions can be used in the indicated region.

Preferably, the targets are vaporized in an oxygen atmosphere, as has already been indicated in the above-described exemplary embodiments 1 and 2. According to the invention, the targets can be operated with different discharge currents in order to control the vaporization rate.

According to the invention, the chemical composition of the layers is preferably controlled so that the analysis of a layer produced in this way yields a composition of $(Al,Cr)_2O_{3-y}$, where $y \leq 0.3$.

Depending on the case, the coating temperature can be adapted to the substrate material that is to be coated and to the subsequent use. Typically, the coating temperatures are between 100° C. and 600° C.

Since the substrates to be coated can have different shapes and sizes, the embodiment of the substrate holder with which they are secured during the coating in the system is adapted to the shape of the substrate.

All of this results in the fact that in all cases, the above-described chemical composition is in fact retained, but other phase compositions of the oxide layer are produced for the different process parameters.

Figure 3:
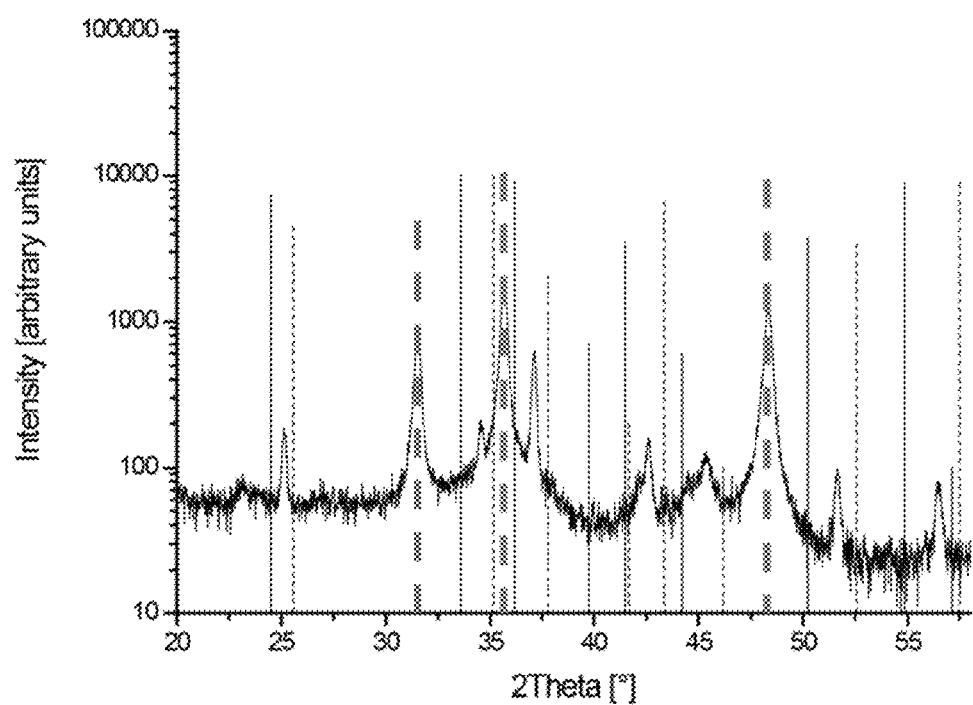
FIG. 3 is an x-ray diffraction diagram of an $(Al,Cr)_2O_3$ layer, which was produced by an $Al_{0.7}Cr_{0.3}$ target and clearly shows the reflections for an $(Al,Cr)_2O_3$ layer in a corundum structure.

The phases of the layer are usually measured using X-ray diffraction (XRD) methods. Consequently, the measured XRD spectrum in some cases can clearly show the reflections for an $(Al,Cr)_2O_3$ layer in a corundum structure, as shown for example in FIG. 3. In this case, FIG. 3 shows the X-ray diffraction diagram of an $(Al,Cr)_2O_3$ layer that was produced by an $Al_{0.7}Cr_{0.3}$ target.

In the figure, the XRD reflections of the positions of the tungsten carbide substrate (thick dashed line) and the positions for the diffraction reflections of $Cr_2O_3$ in an eskolaite structure (solid line) and $Al_2O_3$ in a corundum structure (dashed line) are plotted. Between these two lines is the respective measured diffraction reflection for the synthesized $(Al,Cr)_2O_3$ mixed crystal in a corundum structure, as is to be expected according to Vegard's law.

But if the process conditions are changed as described above, then the crystallite size of the oxide can be so small that the crystallites can no longer be detected with XRD or it is also possible that the change in the process conditions causes the structure of the resulting oxide to even become amorphous.

In such cases, the oxide can no longer be detected in the X-ray spectrum, but in almost every case, materially related compounds can be found, primarily intermetallic phases and metallic mixed crystals of the Al—Cr—O layer. One such materially related compound, for example, is the intermetallic phase $Al_5Cr_5$.

Figure 4:
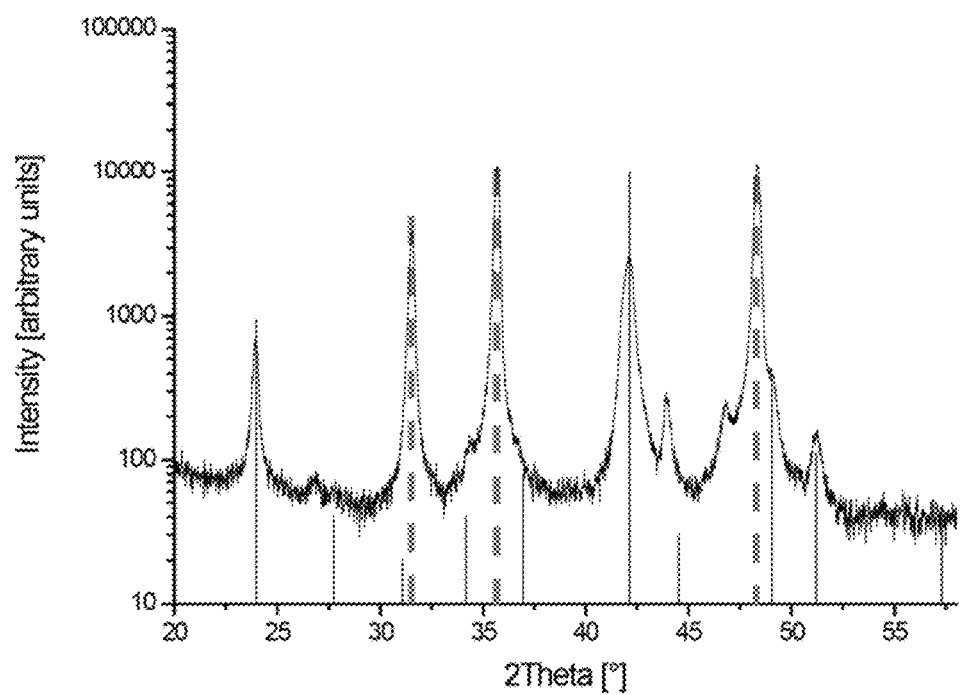
FIG. 4 is an x-ray diffraction diagram of an $(Al,Cr)_2O_3$ layer, which was produced by an $Al_{0.7}Cr_{0.3}$ target and clearly shows the reflections of the crystal structure of the intermetallic phase $Al_8Cr_5$.

A corresponding X-ray diffraction diagram is shown in FIG. 4, which shows an X-ray spectrum measured in one layer, in which, although no oxide phase can be detected, the materially related intermetallic phase $Al_5Cr_5$ is clearly evident. This X-ray diffraction diagram once again illustrates the diffraction reflections for the tungsten carbide substrate (thick dashed line) and in addition, the diffraction reflections for the $Al_8Cr_5$ crystal structure (solid line), which clearly demonstrate the existence of this intermetallic compound in the oxide layer.

In an entirely analogous fashion, under certain process conditions, XRD can be used in the oxide layer, whose chemical composition has been described above, to also detect $Al_4Cr_1$ or $Al_9Cr_4$, for example, or other Al—Cr intermetallic compounds or mixed crystals, individually or together.

The invention claimed is:

1. A PVD-coated part or a PVD-coated component of a turbocharger, comprising:
   a PVD-coated substrate having an oxidation- and chemical barrier layer that includes at least one Al—Cr—O layer, which at least partially has a corundum structure and shows at least reflections of a crystal structure of an AlCr intermetallic phase in an X-ray diffraction diagram, and
   wherein the substrate is a part or component of a turbocharger that is subjected to temperatures greater than 400° C., but not greater than 800° C., during operation of the turbocharger, and wherein a crystallite size of an oxide in the Al—Cr—O layer is so small that oxide crystallites can no longer be detected with XRD and as a result, no oxide phase can be detected in the X-ray diffraction diagram.

2. The PVD-coated part or the PVD-coated component of a turbocharger according to claim 1, wherein the barrier layer includes a chromium nitride layer, which is situated between the substrate and the Al—Cr—O layer.

3. The PVD-coated part or the PVD-coated component of a turbocharger according to claim 1, wherein the chemical composition of the Al—Cr—O layer produces a composition of $(Al,Cr)_2O_{3-y}$, where $y \leq 0.3$.

4. The PVD-coated part or the PVD-coated component of a turbocharger according to claim 1, wherein the X-ray diffraction diagram shows the reflections of an $(Al,Cr)_2O_3$ layer in a corundum structure.

5. The PVD-coated part or the PVD-coated component of a turbocharger according to claim 1, wherein the X-ray diffraction diagram shows the reflections of a crystal structure of an AlCr intermetallic phase.

* * * * *